United States Patent [19]

Fujii et al.

[11] Patent Number: 6,133,781

[45] Date of Patent: Oct. 17, 2000

[54] SEMICONDUCTOR DEVICE UTILIZING UNNECESSARY ELECTRIC CHARGE ON COMPLEMENTARY SIGNAL LINE PAIR

[75] Inventors: Yasuhiro Fujii; Yasurou Matsuzaki, both of Kawasaki, Japan

[73] Assignee: Fujitsu Limited, Kanagawa, Japan

[21] Appl. No.: 09/349,110

[22] Filed: Jul. 8, 1999

[30] Foreign Application Priority Data

Jul. 9, 1998 [JP] Japan ................................. 10-193824

[51] Int. Cl.[7] ........................................................ G05F 3/02
[52] U.S. Cl. ............................ 327/544; 365/203; 365/227
[58] Field of Search .................................. 327/544, 327, 327/309, 374; 365/203, 204, 227; 326/17

[56] References Cited

U.S. PATENT DOCUMENTS 5,485,430  1/1996  McClure ................................ 365/233
6,067,264  5/2000  Kwon ..................................... 365/203

*Primary Examiner*—Jung Ho Kim
*Attorney, Agent, or Firm*—Arent Fox Kintner Plotkin & Kahn, PLLC

[57] ABSTRACT

A switch 17 for short-circuiting is connected between the outputs of circuits 15 and 16 each of which outputs a pair of complementary signals ØS1 and ØR1. The circuits 15 and 16, and the switch 17 are controlled by a changeover control circuit 18 in response to an input signal ØA1. To effectively utilizes electric charge which has become unnecessary on a complementary signal line pair, the circuit 18 comprises an edge detecting circuit for providing a pulse to the switch 17 to make it on in response to the edge of the signal ØA1, and a state control circuit for making the outputs of the circuits 15 and 16 in a high impedance state while the switch 17 being on, and for making the logic states of the signals ØS1 and ØR1 completely transit in response to disappearance of the pulse while the switch 17 being off.

11 Claims, 9 Drawing Sheets

FIG.8(A) prior art
FIG.8(B) prior art
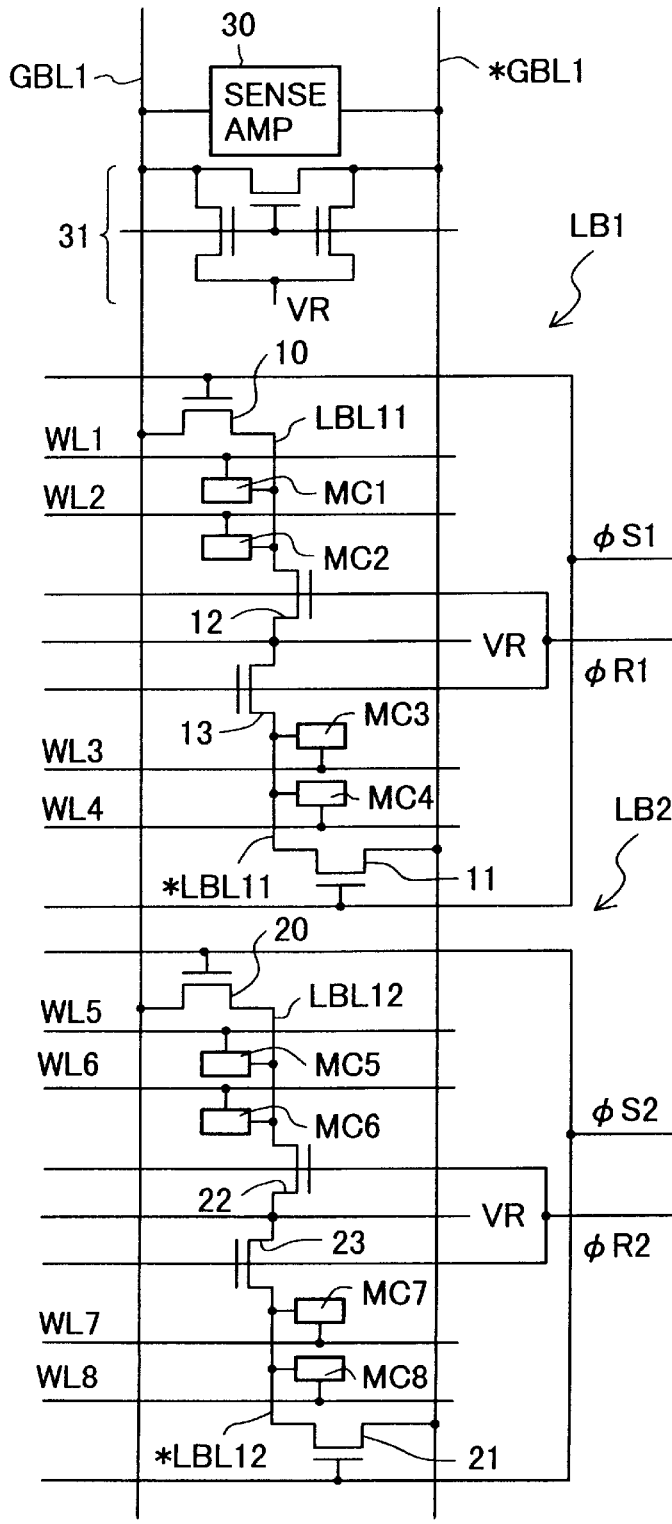
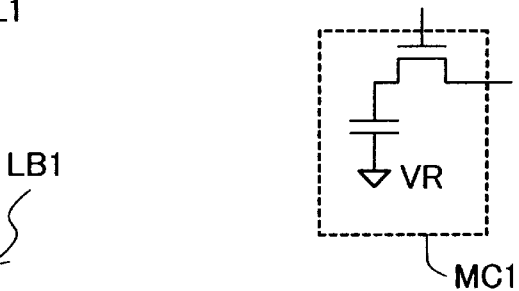

SEMICONDUCTOR DEVICE UTILIZING UNNECESSARY ELECTRIC CHARGE ON COMPLEMENTARY SIGNAL LINE PAIR

BACKGROUND OF THE INVENTION

1. Field of the Invention

The present invention relates to a semiconductor device provided with a circuit for utilizing electric charge which has become unnecessary on a complementary signal line pair.

2. Description of the Related Art

FIG. 8(A) shows a circuit associated with hierarchical bit-line structure in a prior art DRAM.

A local bit-line pair LBL11 and *LBL11 are connected via transfer gates 10 and 11 to a global bit-line pair GBL1 and *GBL1, respectively. In addition, a local bit-line pair LBL12 and *LBL12 are connected thereto via transfer gates 20 and 21, respectively. A reset voltage VR is applied to each of the local bit-line pair LBL11 and *LBL11 via reset switches 12 and 13, respectively, while a reset voltage VR is applied to each of the local bit-line pair LBL12 and *LBL12 via reset switches 22 and 23, respectively. A sense amplifier 30 and a global bit-line resetting circuit 31 are connected between the global bit-line pair GBL1 and *GBL1.

MC1 through MC8 are memory cells, and FIG. 8(A) shows a case where only two memory cells are connected to each of the local bit-lines for simplification. As shown in FIG. 8 (B), in a memory cell, a transfer gate is connected to a capacitor in series, wherein one electrode of the capacitor is connected to a plate of the reset voltage VR.

A local block LB1 containing memory cells MC1 through MC4 and another local block LB2 containing memory cells MC5 through MC8 are not activated at the same time.

For example, in a case where the content of the memory cell MC1 is read out, as a initial state, the reset circuit 31 is on, whereby the global bit-line pair GBL1 and *GBL1 are precharged at the reset voltage VR, the transfer gates 10, 11, 20 and 21 are off and the reset switches 12, 13, 22 and 23 are on, whereby the local bit-line pairs LBL11, *LBL11 and LBL12, *LBL12 are precharged at the reset voltage VR.

From this state, the reset circuit 31, and reset switches 12 and 13 are turned off, the transfer gates 10 and 11 are turned on, and the word line WL1 is raised to read out the content of the memory cell MC1, whereby a voltage difference of about 0.2V between the global bit-line pair GBL1 and *GBL1 arises. This difference is amplified by the sense amplifier 30.

With such a hierarchical bit-line structure, since the number of memory cells simultaneously conducted to the global bit-line pair GBL1 and *GBL1 is decreased and thereby parasitic capacity is reduced, the memory access becomes faster, and further a power consumption is reduced. Furthermore, since the number of memory cells per sense amplifier 30 is increased, higher integration is enabled.

The transfer gates 10 through 13 and 20 through 23 are composed of NMOS transistors, same as those in the transfer gates of the memory cells, to achieve higher integration density. Therefore, in order to turn on each transfer gate, it is necessary to make the gate electrode voltage greater than the value which is the sum of the threshold voltage Vth and source voltage of the transfer gate. For example, if the maximum value VC of the source voltage is 2.5V and the Vth is 1.5V, the gate voltage SVC to turn on the transfer gate is 4.0 or more.

The transfer gates 10 and 11 are turned on and off together with the other transfer gates connected to other global bit-lines (not shown) in the same local block. This is the same as to the reset switches 12 and 13. The on and off of the transfer gates 10 and 11 are the inverse of the on and off of the reset switches 12 and 13.

Therefore, a pair of mutually complementary LBL (Local Bit Line) selection signal ∅S1 and LBL-reset signal ∅R1 are generated at a local bit-line control circuit 14, where ∅S1 is made with boosting a HIGH of a local block selection signal ∅A1 and further amplifying its driving capacity, and the transfer gates 10, 11 and so forth are on-off controlled with the LBL signal ∅S1, and the reset switches 12, 13 and so forth are on-off controlled with the LBL-reset signal ∅R1. A local bit-line control circuit 24 for the local block LB2 is the same structure as the local bit-line control circuit 14 for the local block LB1.

FIG. 9 shows a structure of the local bit-line control circuit 14.

A level shift circuit 141 generates, in response to a local block selection signal ∅A1, mutually complementary signals ∅A1V and *∅A1V, where ∅A1V is made with boosting a HIGH of ∅A1 from a supply voltage VC to a supply voltage SVC. A drive circuit 142A inverts the logic state of the signal *∅A1V and further amplifies its driving capacity to make the LBL-selection signal ∅S1, while a drive circuit 142B inverts the logic state of the signal ∅A1V and further amplifies its driving capacity to make the LBL-reset signal ∅R1.

In this way, since it is necessary to turn on and off a number of NMOS transistors at the same time after boosting a HIGH voltage and further amplifying it at the local bit-line control circuit 14, for example, a current consumption of the local bit-line control circuit becomes 20 mA through 30 mA in a 256 MB DRAM. Such a problem will occur in a semiconductor device provided with a similar circuit.

SUMMARY OF THE INVENTION

Accordingly, it is an object of the present invention to provide a semiconductor device which is able to reduce a power consumption with utilizing electric charge having become unnecessary on a complementary signal line pair.

In one aspect of the present invention, there is provided a semiconductor device including a signal generating circuit having first and second outputs for providing first and second signals, respectively, in response to an input signal, the signal generating circuit comprising: a short-circuiting switch having a control input and a current path coupled between the first and second outputs; an edge detecting circuit for generating an edge detected pulse in response to an edge of the input signal and providing the edge detected pulse to the control input of the short-circuiting switch; and a state controlling circuit for controlling the first and second outputs into a high impedance state in response to the edge detected pulse.

With the present invention, when an edge of the input signal is detected, a current flows from one of the first and second output lines to the other thereof through the short-circuiting switch with the first and second outputs in a high impedance state. Thereafter, logic states of the first and second outputs transit completely. Therefore, electric charge which has become unnecessary on the first or second output line is effectively utilized, resulting in reducing power consumption.

Other aspects, objects, and the advantages of the present invention will become apparent from the following detailed description taken in connection with the accompanying drawings.

BRIEF DESCRIPTION OF THE DRAWINGS

FIGS. 8(A) and 8(B) are diagrams is a diagram showing a circuit associated with a hierarchical bit-line structure in a prior art DRAM.

DESCRIPTION OF THE PREFERRED EMBODIMENTS

Figure 1:
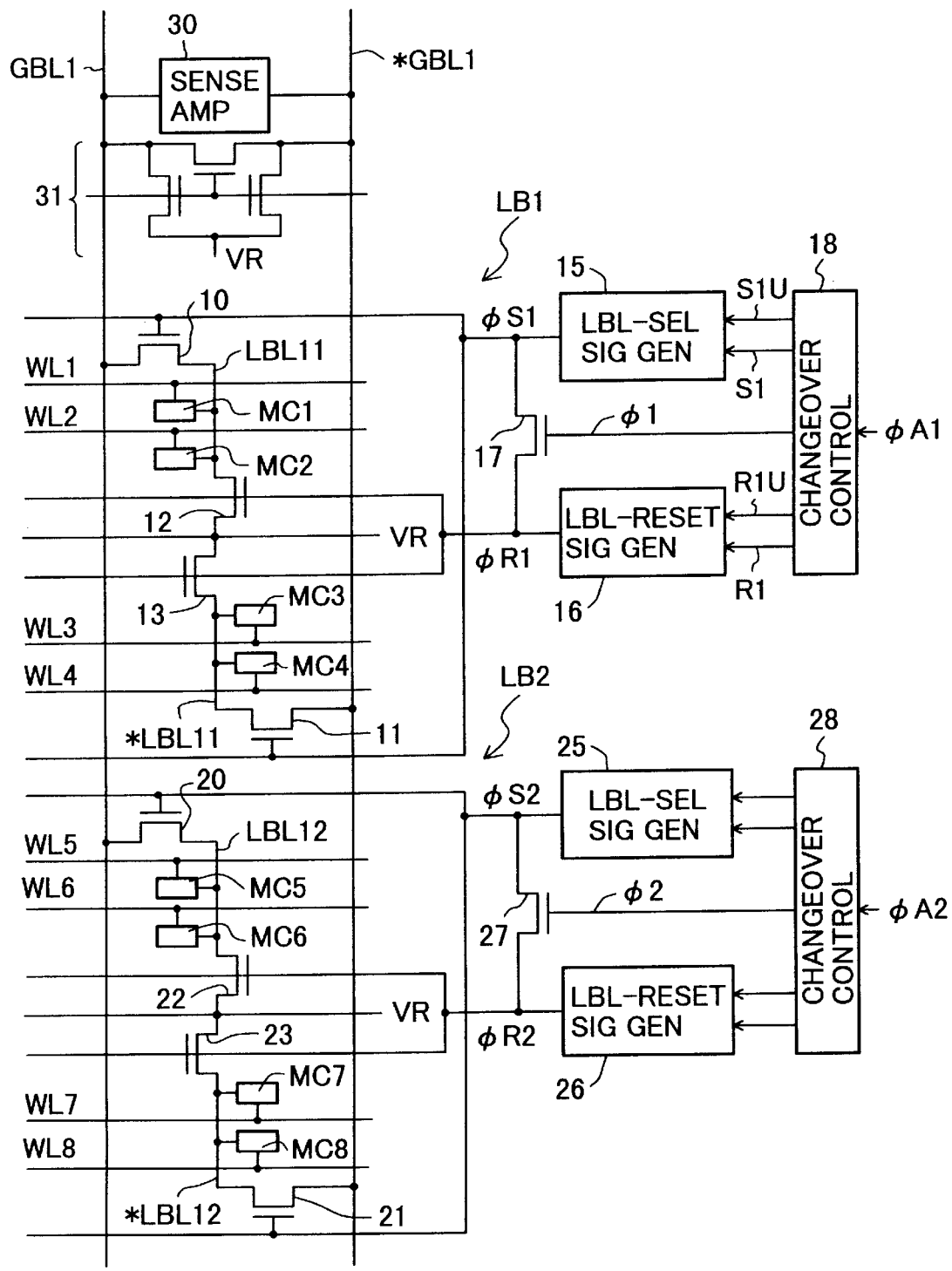
FIG. 1 is a diagram showing a circuit associated with a hierarchical bit-line structure in a DRAM according to the first embodiment of the present invention.

Referring now to the drawings, wherein like reference characters designate like or corresponding parts throughout several views, preferred embodiments of the present invention are described below. A signal which is active low will be denoted with adding "*" to a reference character.

It should be noted that the use of the terms "connected" and "coupled" indicates an electrical connection between two elements and can include an intervening element between the two "coupled" or "connected" elements.
First Embodiment FIG. 1 shows a circuit associated with a hierarchical bit-line structure in a DRAM according to the first embodiment of the present invention. A description of the same part to that shown in FIG. 8 is omitted to avoid double explanation.

An LBL-selection signal generating circuit 15 generates an LBL-selection signal ØS1 to provide to the gate electrodes of the transfer gates 10 and 11 in response to signals S1U and S1. The LBL-reset signal generating circuit 16 generates an LBL-reset signal ØR1 to provide to gate electrodes of reset switches (NMOS transistors) 12 and 13 in response to the signals R1U and R1. A short-circuiting switch 17 is connected between the outputs of the circuits 15 and 16.

Figure 2:
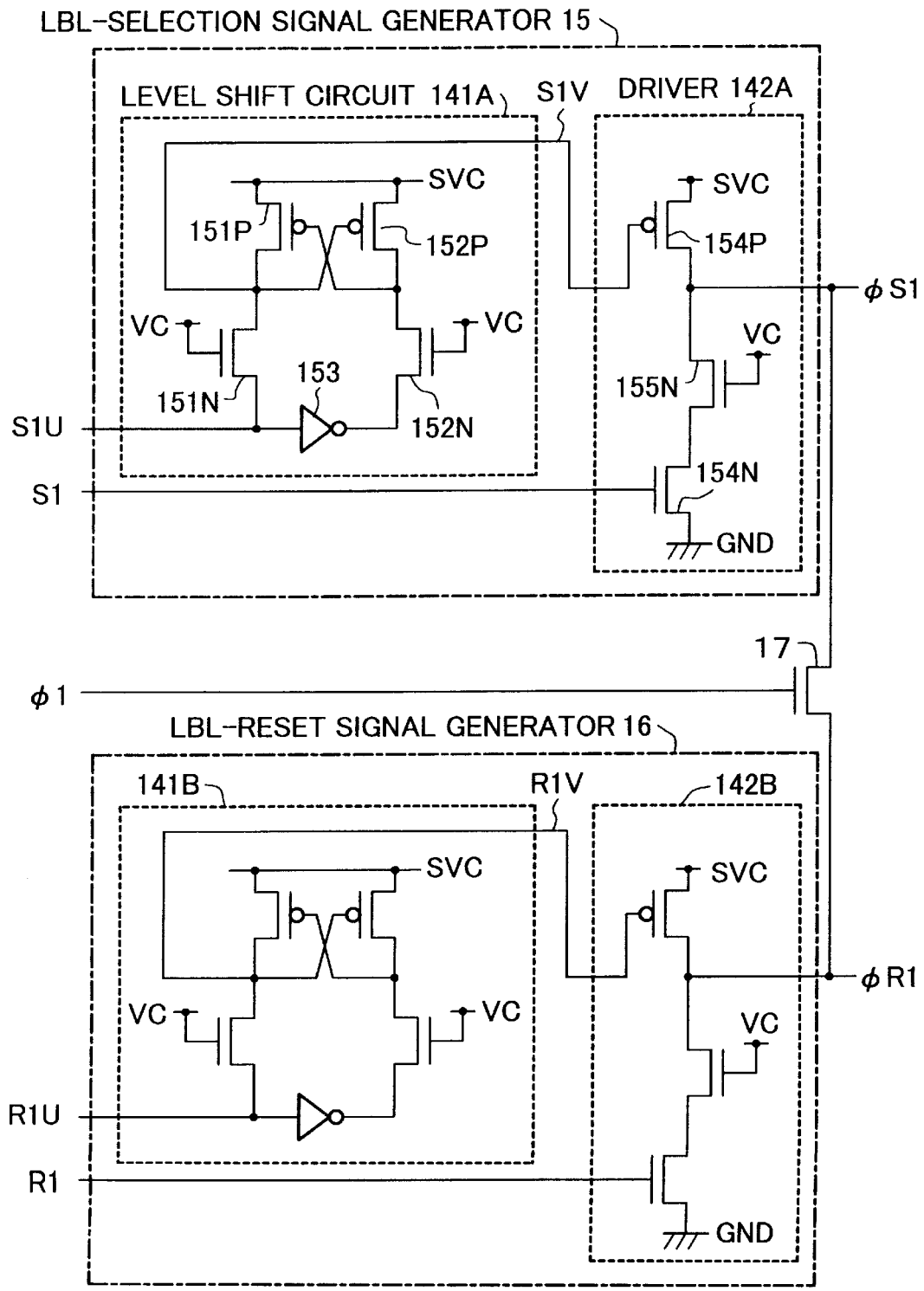
FIG. 2 is a diagram showing a structural example of the LBL-selection signal generating circuit and the LBL-reset signal generating circuit in FIG. 1.

FIG. 2 shows a structural example of the LBL-selection signal generating circuit 15 and the LBL-reset signal generating circuit 16 in FIG. 1. The circuit 15 is provided with a level shift circuit 141A and a drive circuit 142A.

Figure 9:
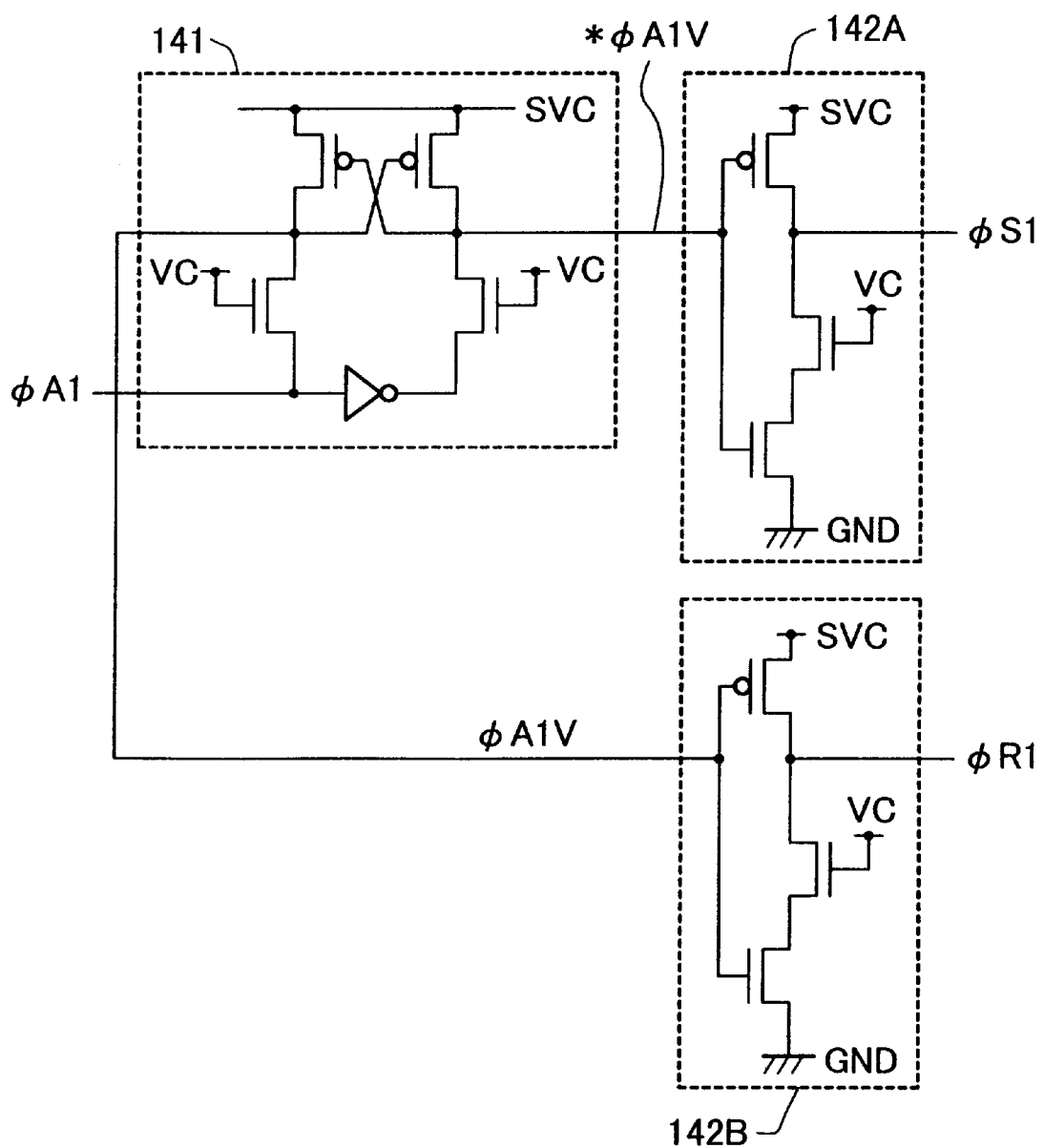
FIG. 9 is a diagram showing a structure of the local bit-line controlling circuit in FIGS. 8(A) and 8(B).

The level shift circuit 141A generates a signal S1V made with boosting a high voltage VC to a higher voltage SVC. A low of signals S1U and S1V is 0V. The level shift circuit 141A has the same structure as that of the level shift circuit 141 in FIG. 9, wherein PMOS transistors 151P and 152P are cross-coupled to each other, NMOS transistors 151N and 152N are connected in series to the PMOS transistors 151P and 152P, respectively, and an inverter 153 is connected between the source electrodes of NMOS transistors 151N and 152N. The power source voltage VC is applied to the gate electrodes of the NMOS transistors 151N and 152N, and the inverter 153 is operated with the power source voltage VC.

When the signal S1U turns low, the NMOS transistor 151N turns on, the NMOS transistor 152N turns off, the signal S1V and the gate of the PMOS transistor 152P become low, whereby the PMOS transistor 152P turns on, the gate voltage of the PMOS transistor 151P becomes a higher voltage SVC, and the PMOS transistor 151P turns off. When the signal S1U turns high, the NMOS transistor 151N turns off, the NMOS transistor 152N turns on, whereby the gate of the PMOS transistor 151P becomes low, the PMOS transistor 151P turns on, the signal S1V becomes a voltage SVC, further the gate of the PMOS transistor 152P becomes high, and the PMOS transistor 152P turns off.

The drive circuit 142A generates the LBL-selection signal ØS1 made with inverting the logic state of the signal S1V and amplifying its driving capacity. The drive circuit 142A has the same structure as that shown in FIG. 9, wherein an NMOS transistor 155N is connected between a PMOS transistor 154P and an NMOS transistor 154N. The NMOS transistor 155N prevents the transistor 154N from deteriorating due to hot electrons with lowering the voltage between the drain and source electrodes of the NMOS transistor 154N. Signals S1V, S1 and the power source voltage VC are provided to the gate electrodes of the PMOS transistor 154P and NMOS transistors 154N and 155N, respectively.

When the signals S1U and S1 is high and low, respectively, both of the PMOS transistor 154P and the NMOS transistor 154N are off, and the output of the LBL-selection signal generating circuit 15 is in a high impedance state. When both of the signals S1U and S1 are high, the PMOS transistor 154P is off and the NMOS transistor 154N is on, whereby the output S1 of the LBL-selection signal generating circuit 15 is low. When both of the signals S1U and S1 are low, the PMOS transistor 154P on and the NMOS transistor 154N is off, whereby the output S1 of the LBL-selection signal generating circuit 15 is high.

The LBL-reset signal generating circuit 16 has the same structure as that of the LBL-selection signal generating circuit 15, and circuits 141B, 142B and signal R1V correspond to the circuits 141A, 142A and the signal S1V, respectively, of the LBL-selection signal generating circuit 15.

In FIG. 1, a changeover control circuit 18 provides an edge detection signal Ø1 of a low to the gate of the short-circuiting switch 17 to turn off the short-circuiting switch 17 when the local block selection signal ØA1 is in the steady state of a high or a low.

When the local block selection signal ØA1 is low and in the steady state, the changeover control circuit 18 make the signals S1U and S1 high to cause the LBL-selection signal generating circuit 15 to make the output ØS1 of the LBL-selection signal generating circuit 15 low, and make the signals R1U and R1 low to cause the LBL-reset signal generating circuit 16 to make the output ØR1 of the LBL-reset signal generating 16 high.

When the local block selection signal ØA1 is high and in the steady state, the changeover control circuit 18 make the signals S1U and S1 low to cause the LBL-selection signal generating circuit 15 to make the output ØS1 of the LBL-selection signal generating circuit 15 high, and make the signals R1U and R1 high to cause the LBL-reset signal generating circuit 16 to make the output ØR1 of the LBL-reset signal generating 16 low.

In response to a high to low or a low to high transition of the local block selection signal ØA1, the changeover control circuit 18 generates a pulse of the edge detecting signal Ø1 to turn on the short-circuiting switch 17, and also makes the signals S1U and R1U high and makes the signals S1 and R1 low to cause the outputs of the LBL-selection signal generating circuit 15 and LBL-reset signal generating circuit 16 to go into a high impedance state.

Figure 4:
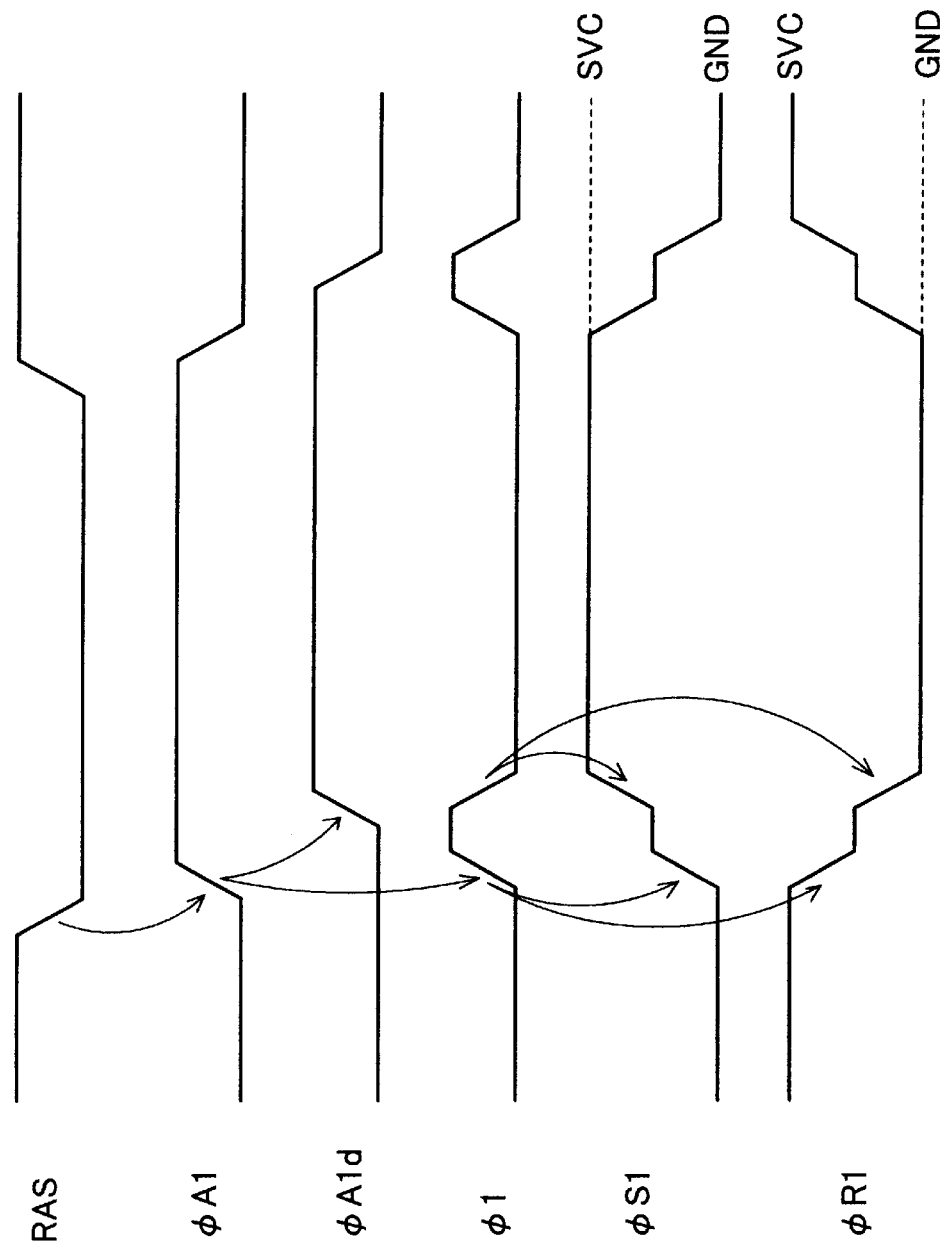
FIG. 4 are time charts showing operation of the circuits in FIGS. 2 and 3.

When the signal ∅A1 is low as shown in FIG. 4, that is, if the signal ∅S1 is low and the signal ∅R1 is high, in response to a low to high transition, an electric current flows from the signal line ∅R1 through the short-circuiting switch 17 to the signal line ∅S1 with the outputs of the circuits 15 and 16 being in a high impedance state, whereby the voltage of the signal ∅S1 rises and the voltage of the signal ∅R1 falls. Thereafter, the pulse of the edge detecting signal ∅1 disappears and the short-circuiting switch 17 turns off, then with the outputs of the circuits 15 and 16, the logic states of the signals ∅S1 and ∅R1 are completely inverted to transit to SVC and 0, respectively. In this way, the output current of the LBL-selection signal generating circuit 15 is enough with only half of a prior art current.

Similarly, when the signal ∅A1 transits from a high to a low, an electric current flows from the signal line S1 through the short-circuiting switch 17 to the signal line ∅R1 with the outputs of the circuits 15 and 16 being in a high impedance state, thereafter, with the outputs of the circuits 15 and 16, the logic states of the signals ∅S1 and ∅R1 are completely inverted to transit to 0 and SVC, respectively. In this way, the output current of the LBL-selection signal generating circuit 15 is enough with only half of a prior art current.

Thus, electric charge which has become unnecessary on a complementary signal line pair can be effectively utilized, and a current consumption to generate the LBL-selection signal ∅S1 and the LBL-reset signal ∅R1 can be reduced to half. The current consumption at the changeover control circuit 18 is sufficiently small than that at the LBL-selection signal generating circuit 15 and LBL-reset signal generating circuit 16.

The local block selection signal ∅A1 is generated in response to a low address strobe signal RAS as shown in FIG. 4 if any one of the word lines WL1 through WL4 is selected by an address.

Figure 3:
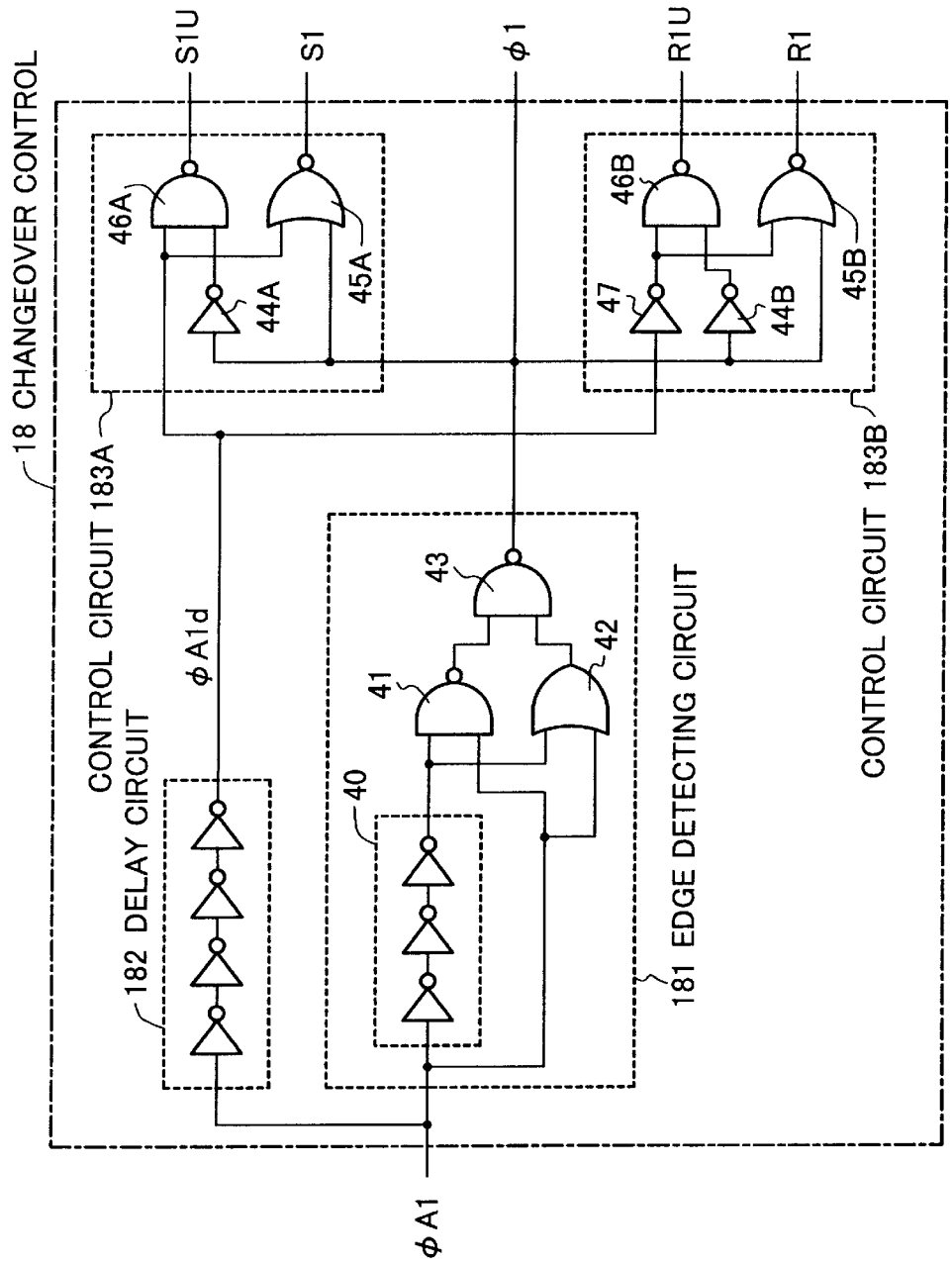
FIG. 3 is a diagram showing a structural example of the changeover control circuit in FIG. 1.

FIG. 3 shows a structural example of the changeover control circuit 18 in FIG. 1. This circuit 18 consists of an edge detecting circuit 181 which generates a pulse of the signal ∅1 in response to an edge of the local block selection signal ∅A1, and a state controlling circuit which controls the output state of the LBL-selection signal generating circuit 15 and LBL-reset signal generating circuit 16.

This edge detecting circuit 181 is known in the art, wherein each of a NAND gate 41 and an OR gate 42 receives the local block selection signal ∅A1 and a signal delayed and inverted by a delay and inverse circuit 40, the outputs of the NAND gate 41 and the OR gate 42 are provide to a NAND gate 43, and the NAND gate 43 provide the edge detecting signal ∅1. When the signal ∅A1 is low or high and in a steady state, the outputs of both NAND gate 41 and OR gate 42 are high, and the signal ∅1 is low. When the signal ∅A1 has transited from a low to a high and the transition is propagating in the delay and inverse circuit 40, the outputs of the NAND gate 41 and the OR gate 42 become low and high, respectively, thereby the edge detection signal ∅1 turns to high. Also, the signal ∅A1 has transited from a high to a low and the transition is propagating in the delay and inverse circuit 40, the outputs of the NAND gate 41 and the OR gate 42 become high and low, respectively, thereby the edge detection signal ∅1 turns to high.

Therefore, the waveform of the edge detection signal ∅1 responding to the local block selection signal ∅A1 becomes as shown in FIG. 4.

The above-described state controlling circuit consists of a delay circuit 182 which delays the local block selection signal ∅A1 to make a signal ∅A1d as shown in FIG. 4, a control circuit 183A which makes the signals S1U and S1 on the basis of the signals ∅A1d and ∅1, and a control circuit 183B which makes the signals R1U and R1 on the basis of the signals ∅A1d and ∅1. The delay circuit 182 is for preventing the signals S1U and S1 from transiting during the term from the beginning of transition of the signal ∅A1 until the signal ∅1 becomes high.

In the control circuit 183A, the edge detection signal ∅1 and its inverse signal passed through an inverter 44A are provided to a NOR gate 45A and a NAND gate 46A, respectively. Thereby, when the signal ∅1 is high, the signals S1U and S1 become high and low, respectively, regardless of the logic state of the signal ∅A1d, whereby the output of the LBL-selection signal generating circuit 15 in FIG. 2 becomes a high impedance state.

A signal ∅A1d is provide to the other input of each of the NOR gate 45A and NAND gate 46A. When the signal ∅1 is low, each of the NAND gate 46A and the NOR gate 45A functions as an inverter for the signal ∅A1d, and the =signals S1U and S1 become the inverse of the logic state of the signal ∅A1d.

In the control circuit 183B, the edge detection signal ∅1 and its inverse signal passed through an inverter 44B are provided to a NOR gate 45B and a NAND gate 46B, respectively. Thereby, when the signal ∅1 is high, the signals R1U and R1 become high and low, respectively, regardless of the logic state of the signal ∅A1d, whereby the output of the LBL-reset signal generating circuit 16 in FIG. 2 becomes a high impedance state.

The signal ∅A1d passes through a inverter 47 and it is provided to the other input of each of the NOR gate 45B and NAND gate 46B. When the signal ∅1 is low, each of the NAND gate 46A and the NOR gate 45A combined with the inverter 47 function as a non-inverter for the signal ∅A1d, and the signals R1U and R1 become the same as the logic state of the signal ∅A1d.

With this construction, the change control circuit 18 operates as described above.

Second Embodiment

Figure 5:
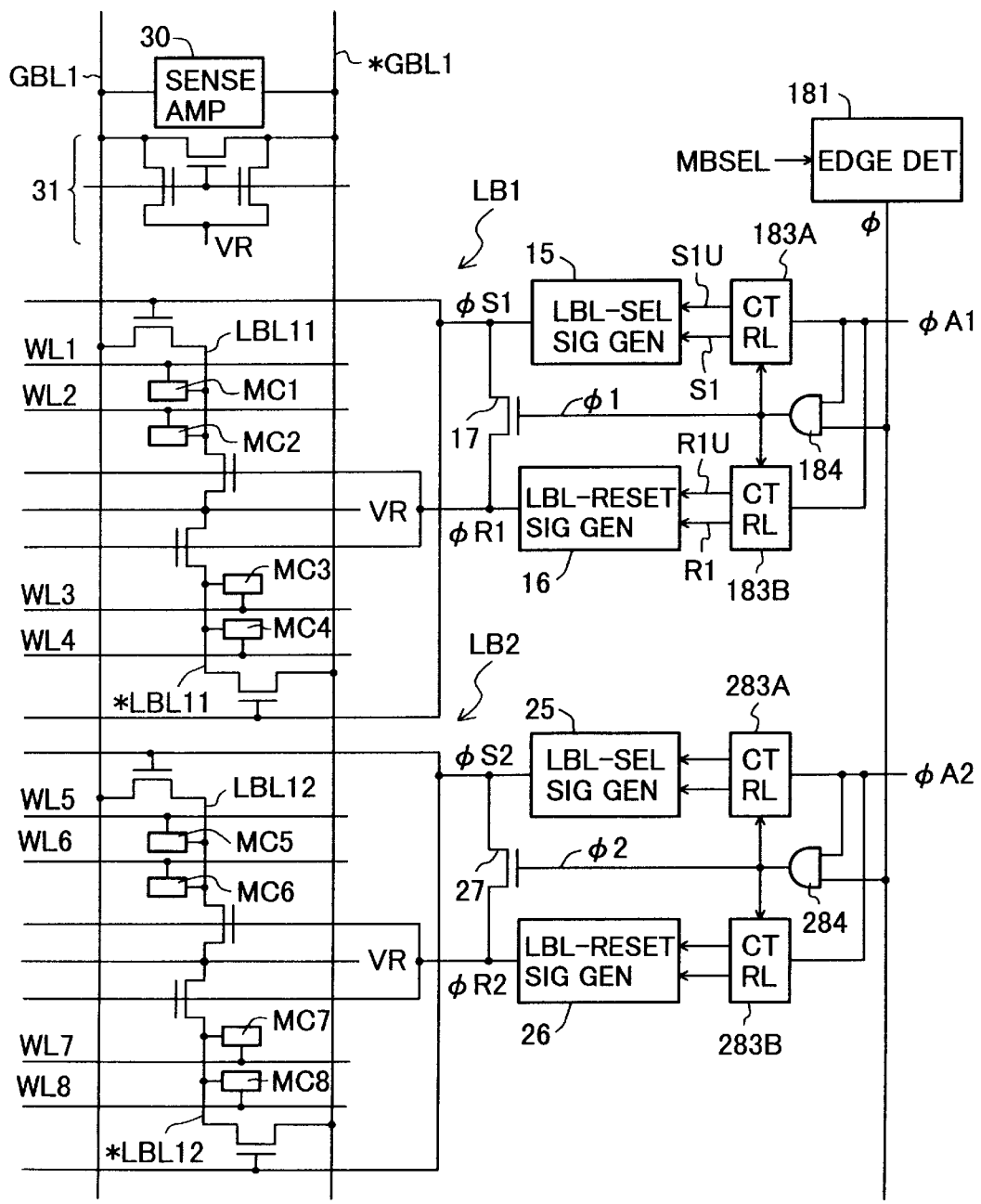
FIG. 5 is a diagram showing a circuit associated with a hierarchical bit-line structure in a DRAM according to a second embodiment of the present invention.

FIG. 5 shows a circuit associated with a hierarchical bit-line structure in a DRAM according to the second embodiment of the present invention.

In FIG. 1, for each of a plurality of local blocks in a memory block, an edge detecting circuit 181 in the changeover control circuit 18 shown in FIG. 3 is arranged. However, in FIG. 5, since the edge detecting circuit 181 is commonly employed for a plurality of local blocks in the same memory block, the entire structure can be simplified.

Figure 6:
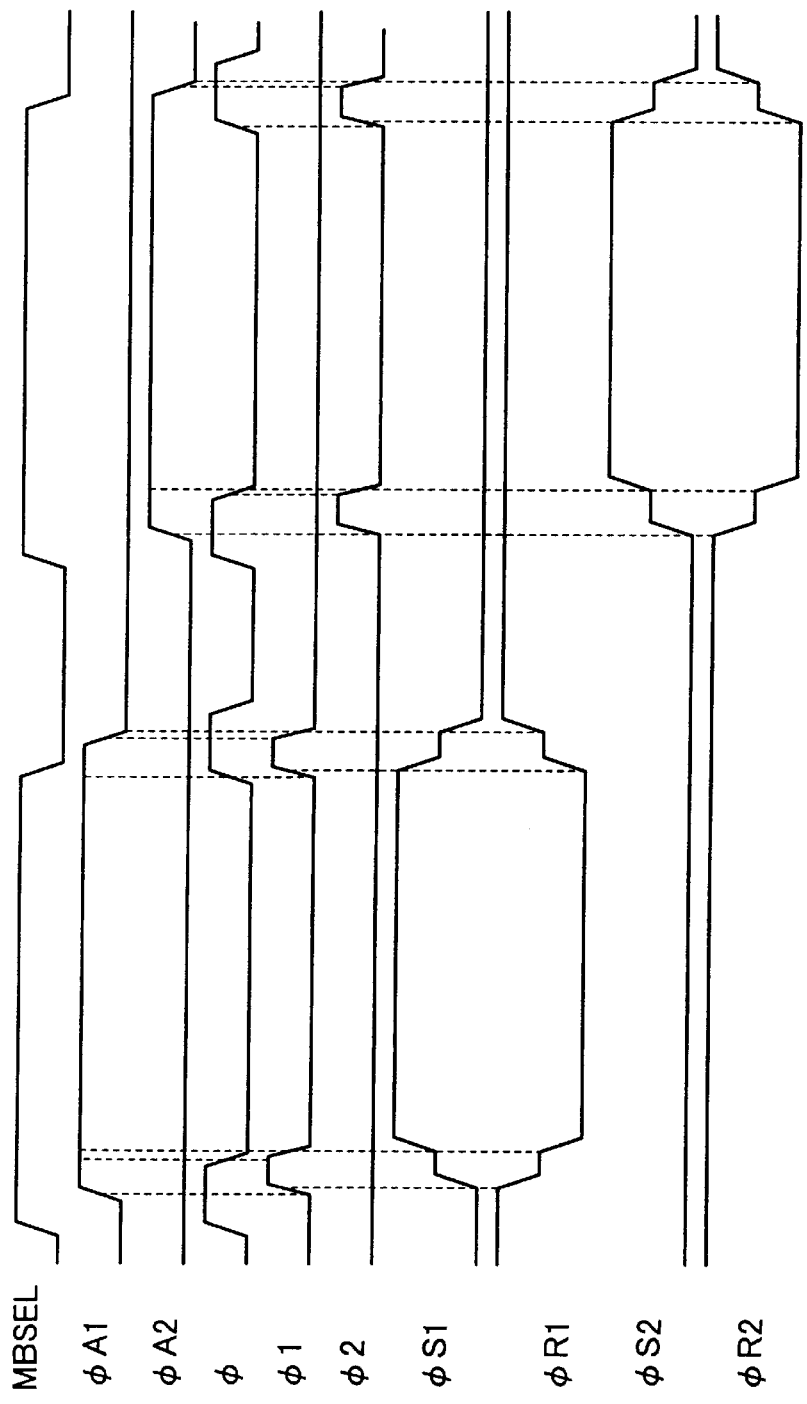
FIG. 6 are time charts showing operation of the local bit-line controlling circuit in FIG. 5.

The edge detecting circuit 181 detects the edge of a memory block selection signal MBSEL as shown in FIG. 6 and provides an edge detection signal ∅. The signal MBSEL becomes active whenever any one of the local blocks in the memory block is activated. The edge detection signal ∅ and the local block selection signal ∅A1 are provide to an AND gate 184, and the output of the AND gate 184 is used as the edge detection signal ∅1 in FIG. 3. Since a pulse of the signal ∅A1 is a corresponding one of the pulses of the delayed signal of MBSEL, the delay circuit 182 in FIG. 3 is omitted, and the signal ∅A1 is used as the signal ∅A1d in FIG. 3.

An AND gate 284, control circuits 283A and 283B for the local block LB2 correspond to the AND gate 184, control circuits 183A and 183B for the local block LB1, respectively.

All the other points are identical to those in the above-mentioned first embodiment.

FIG. 6 shows the output signals ∅S1, ∅R1, ∅1, ∅S2, ∅R2, and ∅2 of the LBL-selection signal generating circuit 15, the LBL-reset signal generating circuit 16, the AND gate 184, the LBL-selection signal generating circuit 25, the LBL-reset signal generating circuit 26 and the AND gate 284, respectively.

Third Embodiment

Figure 7:
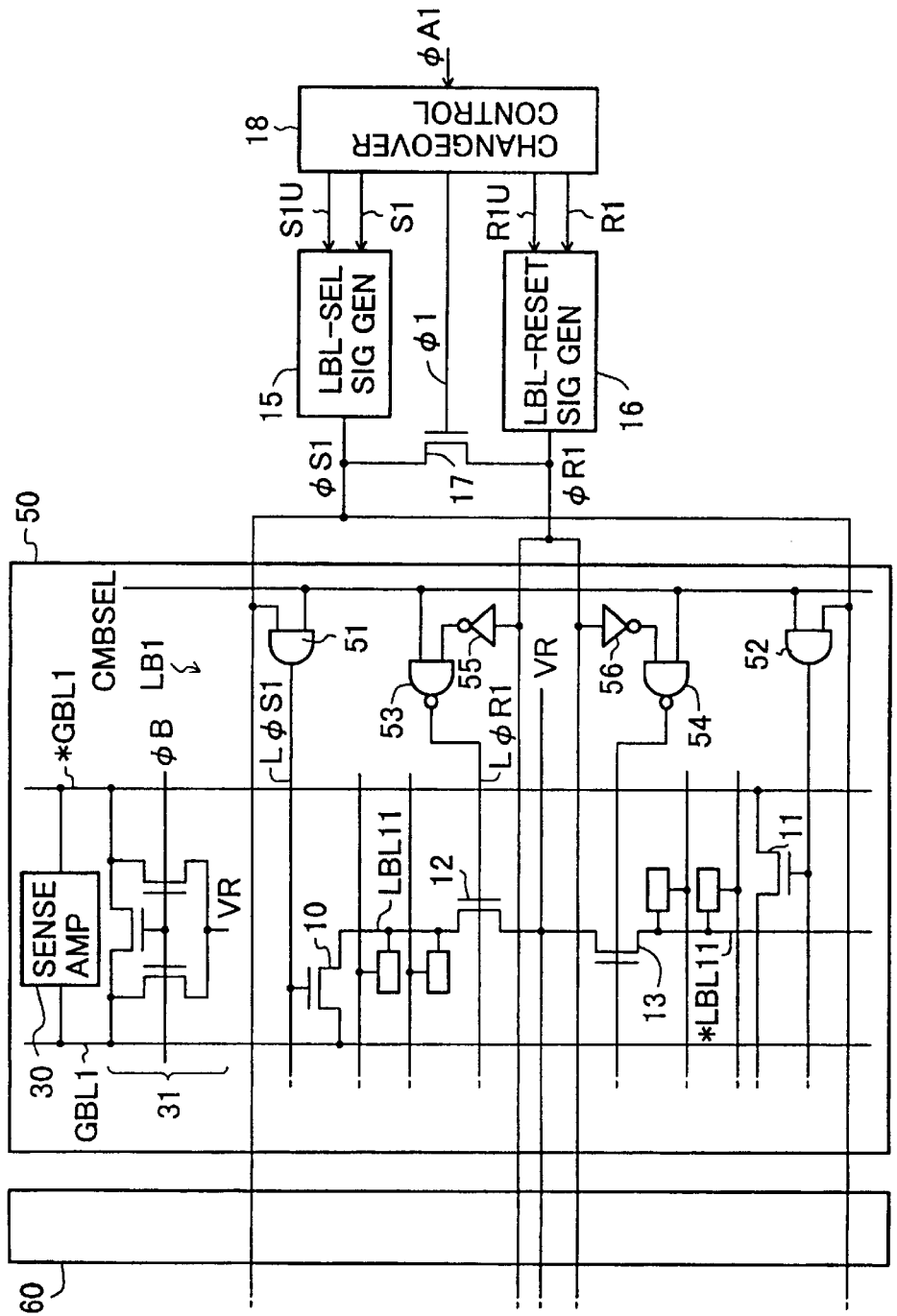
FIG. 7 is a diagram showing a circuit associated with a hierarchical bit-line structure in a DRAM according to a third embodiment of the present invention.

FIG. 7 shows a circuit associated with a hierarchical bit-line structure in a DRAM according to the third embodiment of the present invention.

In the circuit, only an internal word line in a selected one of column memory blocks 50, 60 and so forth is raised in order to reduce power consumption.

Since a signal line ØS1 is commonly used in the column memory blocks, the signal line is rather long and the parasitic capacity is also comparatively large. Therefore, when the local block LB1 in the column memory block 50 is selected, in order to reduce power consumption by controlling only the transfer gates 10 and 11 with the LBL-selection signal ØS1, a column memory block selection signal CMBSEL and the LBL-selection signal ØS1 are provide to AND gates 51 and 52, and the gate electrodes of the transfer gates 10 and 11 are controlled by the outputs of the AND gates 51 and 52, respectively. Similarly in order to reduce power consumption by controlling only the reset switches 12 and 13 with the LBL-reset signal ØR1, the signal CMBSEL and the output of a inverter 55 which receives the signal ØR1 are provide to NAND gate 53, the signal CMBSEL and the output of a inverter 56 which receives the signal ØR1 are provide to NAND gate 54, and the gate electrodes of the reset switches 12 and 13 are controlled by the outputs LØR1 of the NAND gates 53 and 54, respectively. The AND gates 51, 52, the NAND gates 53, 54 and the inverters 55 and 56 are operated with the power source voltage SVC.

When the column memory block 50 is not activated, the column memory block selection signal CMBSEL is low, the outputs of the AND gates 51 and 52 are low, and the outputs of the NAND gates 53 and 54 are high, whereby both of the transfer gates 10 and 11 maintain off, both of the reset switches 12 and 13 maintain on, and the local bit-line pair LBL11 and *LBL11 are precharged to the reset voltage VR. The column memory block 50 is activated with the column memory block selection signal CMBSEL becoming high, and the transfer gates 10 and 11 are turned on with the LBL-selection signal ØS1 passing through the AND gates 51 and 52, while the reset switches 12 and 13 are turned of f with the LBL-reset signal ØR1 passing through the NAND gates 53 and 54.

All other points are identical to those of the above first embodiment.

Although preferred embodiments of the present invention has been described, it is to be understood that the invention is not limited thereto and that various changes and modifications may be made without departing from the spirit and scope of the invention.

For example, a signal generating circuit of the present invention is applicable to a semiconductor device other than a memory device. Also, the outputs of the signal generating circuit may not always be a pair of complementary signals, and it may be configured so that an edge detecting pulse is generated only when the outputs become a pair of complementary signals, whereby power consumption can be reduced.

What is claimed is:

1. A semiconductor device including a signal generating circuit having first and second outputs for providing first and second signals, respectively, in response to an input signal, said signal generating circuit comprising:

a short-circuiting switch having a control input and a current path coupled between said first and second outputs;

an edge detecting circuit for generating an edge detected pulse in response to an edge of said input signal and providing said edge detected pulse to said control input of said short-circuiting switch; and a state controlling circuit for controlling said first and second outputs into a high impedance state in response to said edge detected pulse.

2. A semiconductor device according to claim 1, wherein said state controlling circuit makes logic states of said first and second outputs transit completely in response to disappearing of said edge detected pulse and a logic state of said input signal.

3. A semiconductor device according to claim 2, wherein said signal generating circuit further comprises a level shift circuit for shifting a voltage of a high logic state so that a high voltage of said first and second signal becomes higher than a high voltage of said input signal.

4. A semiconductor device according to claim 3, wherein said state controlling circuit comprises:

a delay circuit for delaying said input signal;

a first control circuit for controlling in response to said edge detected pulse so that said first output turns into a high impedance state, and for controlling in response to disappearing of said edge detected pulse and said delayed input signal so that said first output transits; and a second control circuit for controlling in response to said edge detected pulse so that said second output turns into a high impedance state, and for controlling in response to disappearing of said edge detected pulse and said delayed input signal so that said second output transits.

5. A semiconductor device including a signal generating circuit having first and second outputs for providing first and second signals, respectively, in response to a first input signal and a second input signal corresponding to a delayed first input signal, said signal generating circuit comprising:

a short-circuiting switch having a control input and a current path coupled between said first and second outputs;

an edge detecting circuit for generating an edge detected pulse in response to an edge of said first input signal and providing said edge detected pulse;

a logic gate circuit having an output for passing through said edge detected pulse while said second input signal is active, said output thereof being coupled to said control input of said short-circuiting switch; and a state controlling circuit for controlling said first and second outputs into a high impedance state in response to a pulse from said output of said logic gate circuit.

6. A semiconductor device according to claim 5, wherein said state controlling circuit makes logic states of said first and second outputs transit completely in response to disappearing of said pulse outputted from said logic gate circuit and a logic state of said second input signal.

7. A semiconductor device according to claim 6, wherein said signal generating circuit further comprises a level shift circuit for shifting a voltage of a high logic state so that a high voltage of said first and second signal becomes higher than a high voltage of said input signal.

8. A semiconductor device according to claim 7, wherein said state controlling circuit comprises:

a first control circuit for controlling in response to said pulse outputted from said logic gate circuit so that said first output turns into a high impedance state, and for controlling in response to disappearing of said pulse outputted from said logic gate circuit and said second input signal so that said first output transits; and a second control circuit for controlling in response to said pulse outputted from said logic gate circuit so that said second output turns into a high impedance state, and for controlling in response to disappearing of said pulse outputted from said logic gate circuit and said second input signal so that said second output transits.

9. A semiconductor device according to claim 1, further comprising a RAM having a global bit-line pair, a local bit-line pair, a pair of transfer gates coupled between said global bit-line pair and said local bit-line pair, and a pair of reset switches coupled between said local bit-line pair and a reset voltage, wherein a pair of said transfer gates are on-off controlled with said first output, and a pair of reset switches are on-off controlled with said second output.

10. A semiconductor device according to claim 9, wherein said transfer gates and said reset switches each have control inputs, and said control inputs of said transfer gates are coupled to said first output and said control inputs of said reset switches are coupled to said second output.

11. A semiconductor device according to claim 9, further comprising logic gates through which signals of said first and second outputs passes only when a corresponding memory block is selected.

* * * * *